United States Patent
Foster

(10) Patent No.: US 10,727,269 B2
(45) Date of Patent: Jul. 28, 2020

(54) DISPLAY PANEL WITH BOARD MOUNTED POWER SUPPLY

(71) Applicant: Ultravision Technologies, LLC, Dallas, TX (US)

(72) Inventor: Matthew Foster, Flower Mound, TX (US)

(73) Assignee: ULTRAVISION TECHNOLOGIES, LLC, Dallas, TX (US)

( * ) Notice: Subject to any disclaimer, the term of this patent is extended or adjusted under 35 U.S.C. 154(b) by 29 days.

(21) Appl. No.: 15/793,333

(22) Filed: Oct. 25, 2017

(65) Prior Publication Data

US 2019/0123094 A1    Apr. 25, 2019

(51) Int. Cl.
| | |
|---|---|
| *G06F 3/14* | (2006.01) |
| *H01L 27/15* | (2006.01) |
| *G09G 3/34* | (2006.01) |
| *G09G 3/32* | (2016.01) |
| *H05B 45/00* | (2020.01) |
| *H05B 47/19* | (2020.01) |

(52) U.S. Cl.
CPC .......... *H01L 27/156* (2013.01); *G06F 3/1446* (2013.01); *G09G 3/32* (2013.01); *G09G 3/3413* (2013.01); *H05B 45/00* (2020.01); *H05B 47/19* (2020.01); *G09G 2330/028* (2013.01)

(58) Field of Classification Search
CPC ............. G06F 3/1446; G02F 1/133308; G02F 1/13452; F16B 5/0664
USPC ................ 1/1; 349/58, 151; 345/82; 361/622
See application file for complete search history.

(56) References Cited

U.S. PATENT DOCUMENTS

| | | | |
|---|---|---|---|
| 8,824,124 B1 * | 9/2014 | Carlson ................. | G06F 3/1446 361/622 |
| 9,069,519 B1 * | 6/2015 | Hall ...................... | G06F 3/1446 |
| 2004/0183984 A1 * | 9/2004 | Imajo .................. | G02F 1/13452 349/151 |
| 2005/0052374 A1 * | 3/2005 | Devos ................... | F16B 5/0664 345/82 |
| 2005/0285990 A1 * | 12/2005 | Havelka ............ | G02F 1/133308 349/58 |

\* cited by examiner

*Primary Examiner* — Abdul-Samad A Adediran
(74) *Attorney, Agent, or Firm* — Slater Matsil, LLP

(57) ABSTRACT

A modular display panel includes a first printed circuit board (PCB) having a first side and a second side. A plurality of LEDs are connected to the first side of the PCB. A receiver circuit is directly mounted to the second side of the first PCB, the receiver circuit having a first plurality of components. A power supply circuit is also directly mounted to the second side of the first PCB, the power supply circuit having a second plurality of components.

37 Claims, 9 Drawing Sheets

DISPLAY PANEL WITH BOARD MOUNTED POWER SUPPLY

TECHNICAL FIELD

The present invention relates generally to displays, and, in particular embodiments, to a system and method for a board mounted power supply in a display panel.

BACKGROUND

Large displays (e.g., billboards), such as those commonly used for advertising in cities and along roads, are widely used to display images, video, or text. The graphics may be projected on a single panel or extended across multiple panels. Each panel may have an array of light emitting diodes (LEDs) to generate the visual graphics. The LED panels may be conventional panels made using discrete LEDs or surface-mounted device (SMD) panels. Most outdoor screens and some indoor screens are built around discrete LEDs, which are also known as individually mounted LEDs. A cluster of red, green, and blue diodes, or alternatively, a tri-color diode, is driven together to form a full-color pixel, usually square in shape. These pixels are spaced evenly apart and are measured from center to center for absolute pixel resolution.

These panels may be powered by one or more external power supplies and a single power supply can power a single panel or a group of panels. Generally, external power supplies are bulky and require separate maintenance and assembly. Additionally, as several panels may be powered by an external power supply, in the case of failure, multiple display panels may simultaneously lose power.

In some instances, manufacturers mount individual encased power supplies inside the display panel housing. This typically results in an increase in the thickness and weight of the individual panels and the bulk of the whole assembly.

SUMMARY

Technical advantages are generally achieved by embodiments of this disclosure which describe systems and methods for a board mounted power supply in a display panel.

In accordance with an embodiment, a modular display panel includes a first printed circuit board (PCB), a plurality of LEDs, a receiver circuit, and a power supply circuit. The first PCB has a first side and a second side. The plurality of LEDs are connected to the first side of the PCB. The receiver circuit is directly mounted to the second side of the first PCB and the receiver circuit includes a first plurality of components. The power supply circuit is directly mounted to the second side of the first PCB and the power supply circuit includes a second plurality of components.

In accordance with another embodiment, a first modular display panel includes a first printed circuit board (PCB), a plurality of LEDs, a receiver circuit, a power supply circuit, and a heatsink. The first PCB has a first side and a second side. The plurality of LEDs are connected to the first side of the PCB. The receiver circuit is directly assembled to the second side of the first PCB and the receiver circuit includes an integrated circuit (IC) soldered to a first region of the first PCB. The power supply circuit is directly assembled to the second side of the first PCB and the power supply circuit includes a plurality of discrete semiconductor devices soldered to a second region of the first PCB. One of the plurality of discrete semiconductor devices is configured to receive alternating current (AC) power. The power supply circuit is configured to convert the AC power to direct current (DC) power. The heat sink is disposed over the power supply circuit and the heat sink is thermally coupled to the power supply circuit to form a part of a major outer surface of the first modular display panel.

In accordance with yet another embodiment, a system includes a plurality of modular display panels, each of the plurality of modular display panels includes a first printed circuit board (PCB), a plurality of LEDs, a receiver circuit, and a power supply circuit. The PCB has a first side and a second side. The plurality of LEDs are connected to the first side of the PCB. The receiver circuit is directly mounted to the second side of the first PCB and the receiver circuit includes a first plurality of components. The power supply circuit is directly mounted to the second side of the first PCB and the power supply circuit includes a second plurality of components.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
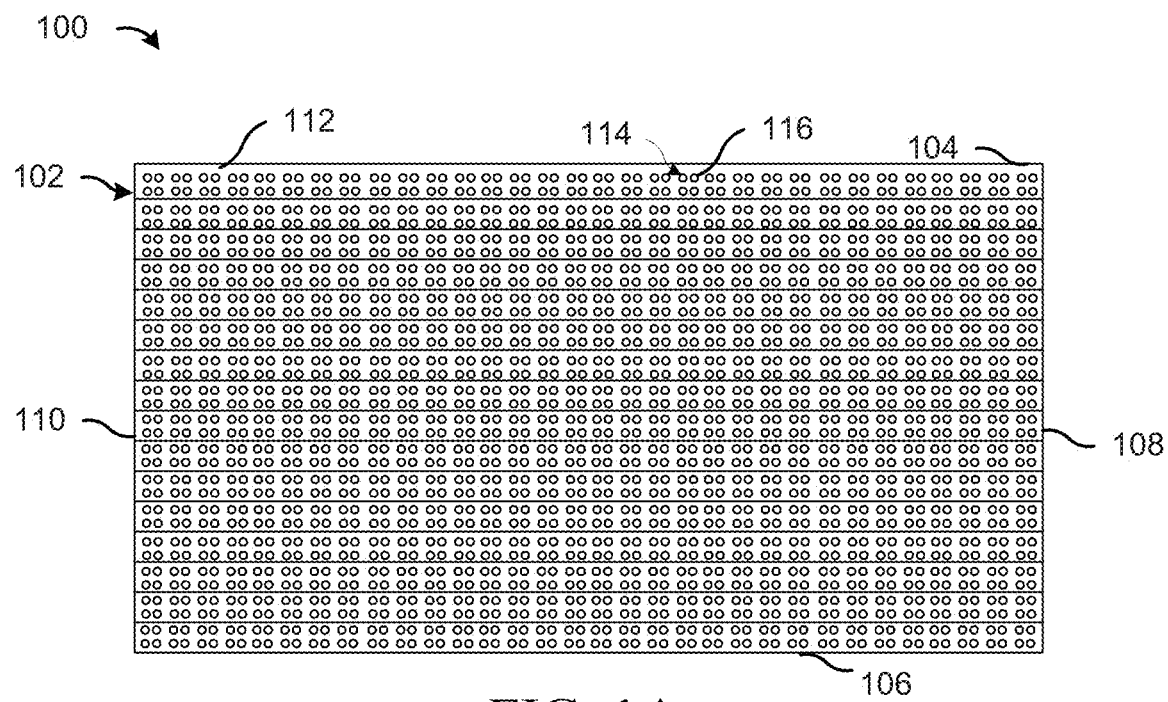
FIGS. 1A-1B illustrate an embodiment of an LED display panel.

This disclosure provides many applicable inventive concepts that can be embodied in a wide variety of specific contexts. The specific embodiments discussed are merely illustrative of specific ways to make and use the invention, and do not limit the scope of the invention.

In the following embodiments, exterior displays are used herein for purposes of example. It is understood that the present disclosure may be applied to lighting for any type of interior and/or exterior display. In some applications, the display may be a billboard that displays a video or a picture of an advertisement. In another application, the display may be a large-screen television designed to accommodate a large venue, such as a stadium or a concert hall. The large-screen television may display a video feed of the event, specific highlights, a replay, or statistics, such as game or player stats to an audience attending the venue.

Generally a large light emitting diode (LED) lit billboard display requires a constant source of power distributed to each panel. One issue with a power supply that feeds multiple display panels is that in the case of power supply failure, multiple panels lose power. Additionally, as standalone components of the larger display board system, these power supplies are bulky and complex to build, maintain, and repair.

To mitigate some of these issues, some manufacturers have mounted individual encased power supplies inside the display panel housing. This approach provides a modular approach to the billboard setup as a whole. Each panel comprises LEDs, an LED receiver circuit assembled on a board, and a power supply in a single package. In case of a failure of any of these components, for example the power supply, a failing panel can be easily swapped with a replacement panel with little impact to its surrounding panels.

A disadvantage of the individual encased power supply is the addition of bulk and weight to the display panel. The display housing is enlarged and thickened to accommodate the power brick, which is typically a rectangular encased box. This addition results in an increase in weight, cost, and size of the individual panels and accordingly to the overall billboard size, weight, and shipping costs.

Another disadvantage of the individual encased power supply is thermal related. The addition of the power brick in the sealed enclosure produces an accumulation of heat that may cause overheating and potentially result in damaging or shortening the life expectancy of the power supply and/or the display panel circuitry. In situations where the display panels are located outdoors and exposed to the sun, the temperature inside the display panel may rise considerably above safe operating temperatures. In some instances fans or other cooling options may be employed to improve heat dissipation. Although these solutions may improve heat dissipation, they result in an increase in system bulk and an increase in vulnerability to the elements that may affect the ingress protection rating of the display panel.

Aspects of this disclosure provide an integrated power supply solution to mitigate the issues with the mounted encased power supply. In an embodiment, a power supply is integrated with an LED receiver circuit in a single and seamless solution as part of a printed circuit board (PCB) assembly (PCBA). The integrated power supply reduces hardware footprint, cost, and time needed to install and maintain the display panel. In such an embodiment, the display panel can be a self-contained block of the display system.

In another embodiment of this disclosure, the PCBA is designed with an interface to accommodate an off the shelf (OTS) power supply. The integrated solution advantageously reduces hardware footprint, cost, and time needed to install and maintain the display panel. In such an embodiment, the display panel can be a self-contained block of the display system.

In yet another embodiment of this disclosure, an expansion card comprising the display panel power supply is mounted to an LED receiver circuit PCB assembly. The daughterboard is an assembled PCB comprising the components necessary to regulate the external power source to the LED receiver circuit and the LEDs. The integrated power supply reduces hardware footprint, cost, and time needed to install and maintain the display panel. In such an embodiment, the display panel can be a self-contained block of the display system.

An embodiment of an LED panel will be described in FIGS. 1A-1B. In FIGS. 2A-B a block diagram of an embodiment power supply circuit of the display panel will be described. A system diagram schematic of an embodiment LED display panel will be described using FIG. 2C. In FIGS. 3A-D various embodiments of an integration of a power supply and a receiver circuit will be described. Embodiments of an LED display panel with a thermal and RF insulator at various viewing angles and cross sections will be described using FIGS. 4A-C. In FIG. 5, an embodiment of a multi-panel LED display will be described. An embodiment of a system having display panels will be described using FIG. 6. In FIG. 7, an alternative embodiment of a system having display panels with wireless connectivity will be described.

An advantage of utilizing the disclosed systems and methods, in one embodiment, is reduction in cost of ownership in the form of bill of materials (BOM). A power supply that is integrated with the LED receiver circuit on an assembly board does not require separate packaging and can be designed as an integrated component of the PCBA. In this manner, a designer can advantageously utilize existing circuitry and layout space to integrate a previously external component onto the LED receiver circuit board. Furthermore, the lighter weight design allows for easier installation and maintenance, and a reduction in shipping cost for individual components and the fully assembled display panels, thus lowering total cost of ownership.

Another advantage of utilizing the disclosed systems and methods, in an embodiment, is a reduction in power supply design fees, integration fees, and manufacturing and assembly costs associated with a discrete power supply. An integrated power supply may minimize layout and design challenges. The PCBA can be designed to concurrently accommodate the requirements of the LED receiver circuit and the power supply circuit. Therefore, each PCBA component is chosen and designed to minimize board dimension while simultaneously meeting the requirements of the LED receiver circuit board and the power supply circuit. Although the designer may still need to consider complexities such as thermal impact, power requirements, and impact of noise emissions to the integrity of the system, an integrated power supply minimizes design and layout challenges as the potential issues are concurrently addressed during the design of the power supply and the receiver circuit board. This advantageously creates a more synchronous and harmonious approach to circuit design.

In an embodiment, the power supply circuit can be designed and integrated with the LED receiver circuit on one or more PCB's mounted in the display panel. In another embodiment, the power supply can be an off the shelf (OTS) component that is, for example, soldered using plated through-hole soldering (PTH) to the LED receiver circuit. In yet another embodiment, the power supply can be a daughterboard mounted onto the LED receiver circuit board. In these embodiments, the power supply is an integrated component of the PCBA, which results in a reduction in size and thickness of the display panel.

Figure 1B:
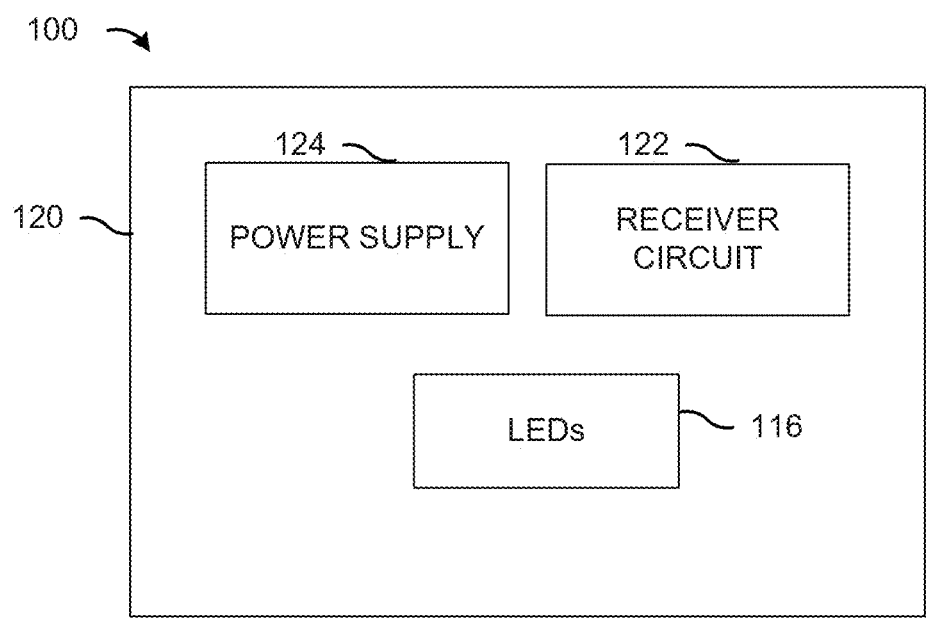
Figure 2A:
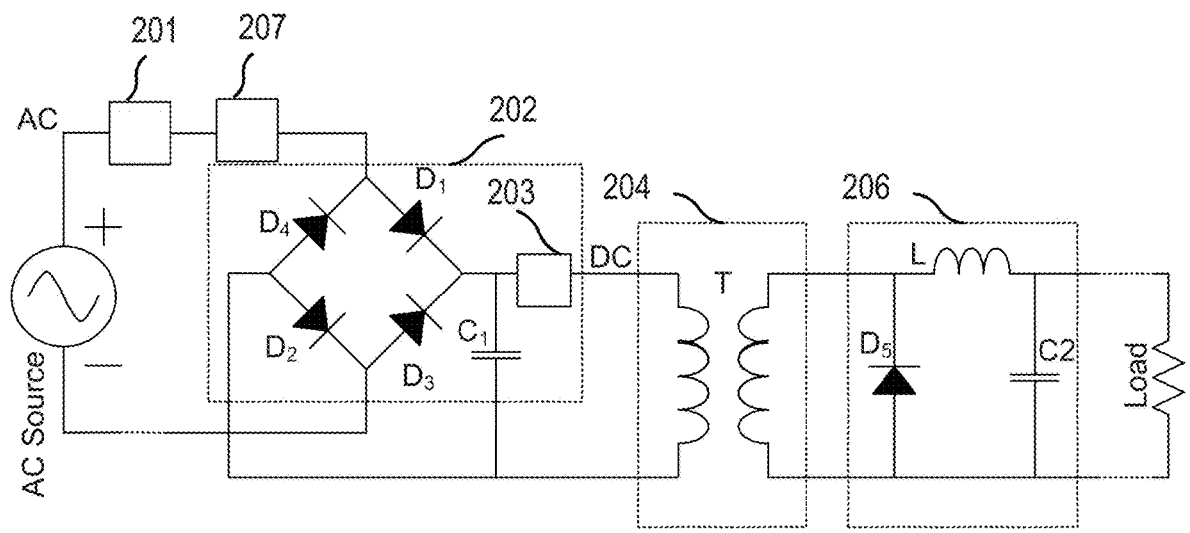
FIG. 2A-B illustrate embodiment power supply circuits of a display panel and FIG. 2C illustrates a system diagram schematic of an LED display panel.
Figure 2B:
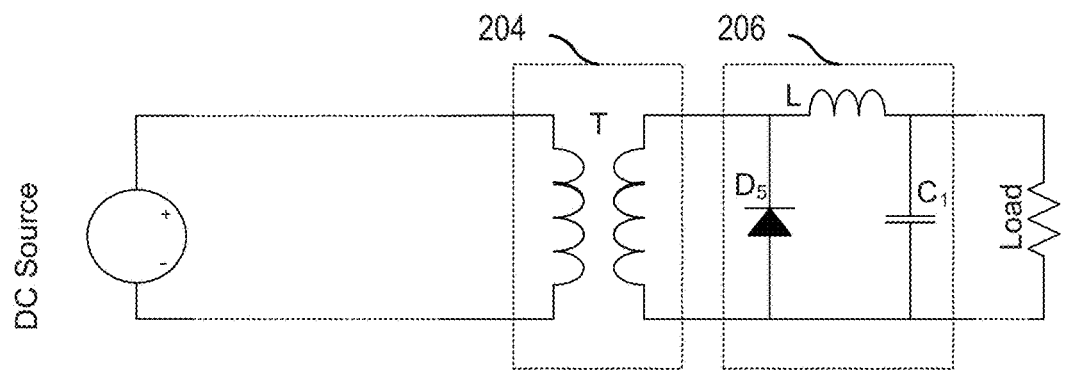

FIGS. 1A-1B illustrate an embodiment of an LED panel 100. FIG. 1A illustrates a front view of a panel 100 with LEDs aligned in a 16×32 configuration. FIG. 1B illustrates a block diagram of the components of the panel 100.

Referring specifically to FIG. 1A, in the present example, the LED panel 100 includes a substrate 102 that forms a front surface of the panel 100. The substrate 102 in the present embodiment is rectangular in shape, with a top edge 104, a bottom edge 106, a right edge 108, and a left edge 110. A substrate surface 112 includes "pixels" 114 that are formed by one or more LEDs 116 on or within the substrate 102. In the present example, each pixel 114 includes four LEDs 116 arranged in a pattern (e.g., a square). For example, the four LEDs 116 that form a pixel 114 may include a red LED, a green LED, a blue LED, and one other LED (e.g., a white LED). In some embodiments, the other LED may be a sensor. It is understood that more or fewer LEDs 116 may be used to form a single pixel 114, and the use of four LEDs 116 and their relative positioning as a square is for purposes of illustration only.

In some embodiments, the LED's may be of a dual in-line package (DIP) LED type. In DIP LED technology, the DIP LED may only display one color per device. As a result, a blue diode, a green diode, and a red diode are typically positioned proximate to each other to form a pixel. DIP diodes typically have a bullet shape design, are generally soldered to a printed circuit board, and may generate between 35 and 80 lumens per watt.

Alternatively, in some embodiments, the LED's may be of a surface-mount device (SMD) LED module type. In an SMD LED module, the LED module is a self-contained surface-mounted LED device that is usually mounted to a PCB. SMD LED's are typically less bulky in comparison with DIP LEDs, generally having a flat design. As SMD LED's have the Red Green Blue (RGB) capability on a single chip, an adjustment of the level output from each diode on the chip creates a desired output color. A typical SMD LED can produce between 50 and 100 lumens per watt.

Other types of LED technology such as organic LED (OLED), edge emitting LED (ELED), chip on board (COB) and multiple chip on board (MCOB), where multiple diodes are positioned on a same chip, can be used in the LED panel 100.

Referring specifically to FIG. 1B, one embodiment of the panel 100 illustrates a housing 120. The housing 120 contains an LED receiver circuit 122, a power supply 124, and the LEDs 116 on or within the substrate 102. The LED receiver circuit 122 is coupled to the LEDs 116. The power supply 124 provides power to the LED panel 100 components, such as the LEDs 116 and the LED receiver circuit 122.

In an embodiment, the LED receiver circuit 122 may be a single chip mounted on a PCB. Alternatively, the LED receiver circuit 122 may comprise of many components mounted on a PCB. The LED receiver circuit 122 may be configured to process received media and control the operation of the individual LEDs 116. As an example, the LED receiver circuit 122 may determine the color of the LEDs 116 to be displayed at each location (pixel). In an embodiment, the LED receiver circuit 122 may receive digital packets or analog signals from an external computer or controller. The LED receiver circuit 122 may then decode, buffer, or perform other signal processing on the received digital packets or analog signals and form a representation of an image to be displayed by controlling the LEDs 116 accordingly.

Similarly, the LED receiver circuit 122 may determine the brightness at each pixel 114 location, for example, by controlling the current supplied to the LEDs 116. In another embodiment, the brightness of the LED 116 may be controlled by turning the LED on and off via pulse-width-modulation (PWM). In some embodiments, the LED receiver circuit 122 and the power supply 124 are configured with both capabilities.

The power supply 124 is typically configured to provide a constant-current drive to the LEDs 116. In some embodiments, the power supply 124 is configured to provide a constant Direct Current (DC) voltage to the LEDs. In an embodiment, the power supply unit 124 may comprise a power converter for converting Alternating Current (AC) to DC, which is then supplied to the LEDs 116. In an embodiment, the power supply 124 converts a 240V or 120V AC to several volts up to in some cases 24V DC. As an example, a display panel may operate at 4.2 V DC, for example, 160 Watts to the LEDs 116 of the panel 100. Advantageously, a display panel can handle either 240V or 120V AC and is therefore compatible worldwide.

In another embodiment, the power supply 124 may comprise a down converter that down converts the voltage suitable for driving the LEDs 116. As an example, the down converter may down convert a DC voltage at a first level (e.g., 12V, 24V, or 48V DC) to a DC voltage at a second level (e.g., 4.2V DC) that is lower than the first level. Examples of down converters (DC-DC converters) include linear regulators and switched mode converters such as buck converters.

In some embodiments, the output from the power supply unit 124 is isolated from the input power, also known as isolated converters. Accordingly, in various embodiments, the power supply 124 may comprise a transformer. In another embodiment, the power supply 124 may comprise forward, half-bridge, full-bridge, or push-pull topologies.

In some embodiments, the ground of the power supply 124 may be isolated from the body of the housing 120 and/or the LED receiver circuit 122 to reduce noisy ground loops (not shown as it is implemented in the board layout internal to the PCB). In an electrical system, a ground loop occurs when a ground reference at two different locations of a circuit have different potentials. A ground loop can cause interference and noise in the video feed and at the LED receiver circuit 122. In an embodiment, the power supply 124 may be placed inside a faraday cage to minimize RF interference with other components. The power supply 124 may also include a control loop circuit to control output current.

Each display panel 100 may have ports and mounting latches to connect to adjacent panels. In these embodiments, data and/or power may be received for only the panel 100 or may be passed on to one or more other panels. Accordingly, the LED receiver circuit 122 and/or power supply 124 may be configured to pass data and/or power to other panels in some embodiments. The control signals and external power may also be fed to each panel in a daisy chain or individually. In some embodiments, the panel may have a socket for registered jack (RJ)45 standard interface. The RJ45 interface allows the display panel to receive signals digital packets or analog signals from an external computer.

In the present example, the housing 120 is sealed to prevent water from entering the housing 120. For example, the housing 120 may be sealed to have an ingress protection (IP) rating such as IP67, which defines a level of protection against both solid particles and liquids. This ensures that the panel 100 can be mounted in inclement weather situations without being adversely affected. In such embodiments, the cooling may be passive as there are no vent openings for air intakes or exhausts. The housing 120 may be made of a thermally conductive material (e.g., aluminum, carbon fiber composite, titanium alloys, thermally conductive plastic) that is relatively light-weight and rigid.

FIG. 2A illustrates an embodiment power supply circuit 200 of a display panel. The power supply circuit 200 includes an AC source, a rectifier 202, a first stage DC to DC converter 204, a second stage DC to DC converter 206, and a load.

The AC source may be an external power supply that is common to all the display panels of a billboard. Alternatively, the AC source may be shared among a group of the display panels of a billboard. The AC source may be 120V, 240V, or 480V AC or greater, depending on commercial, industrial, or residential power supply availability. In some embodiments, the power supply circuit 200 may have a step down transformer 201 to convert a higher voltage (e.g., 240V) to a lower voltage (e.g., 120V). In some embodiments, the power supply circuit may also have an electromagnetic interference (EMI) filter 207 to suppress conducted interference from the AC source power line.

The AC source is connected to the rectifier 202. The rectifier 202 converts the AC input to a DC output. FIG. 2A illustrates a basic type of bridge rectifier comprising of at least four or more diodes arranged in a bridge circuit configuration. Although the rectifier 202 in FIG. 2A is shown as a bridge rectifier, other types of rectifiers such as a full wave bridge rectifier or a half wave rectifier may also be used.

In some embodiments, the rectifier 202 may also include a storage bank C1, such as a capacitor, to smooth out the pulsating DC from the rectifier circuit and provide an average DC voltage at the output of the rectifier 202.

In some embodiments, the rectifier 202 may also include a boost power factor correction (PFC) converter 203. The boost PFC converter 203 is a linear power supply with a boost converter that may be inserted between the basic rectifier circuit and the storage bank C1, as described above. The boost PFC converter 203 rapidly turns a switch on and off at varying duty cycles to put the phase of the input voltage in phase with the phase of the input current of the AC source for passive correction. The boost PFC converter 203 may be utilized to improve the power quality factor of the power supply circuit 200.

The rectifier 202 supplies the DC output to a first stage DC to DC converter 204 to convert the DC output of the rectifier 202 to a lower DC voltage such as 12V-48V at the output of the first stage DC to DC converter 204.

The output of the first stage DC to DC converter 204 may, optionally, be connected to a second stage DC to DC converter 206. The second stage DC to DC converter 206 may convert the DC output (e.g., 12V, 24V, or 48V) of the first stage DC to DC converter to a lower DC output (e.g., 4.2V).

The first stage DC to DC converter 204 or second stage DC to DC converter 206 may be non-isolated (e.g., stepdown (buck) converter, a true buck-boost converter, a split-pi (boost-buck) converter, etc.) or isolated (e.g., a forward converter, a push-pull converter, flyback, etc.) between the converters input and output. The converters may be selected to increase efficiency in the DC to DC conversion and therefore reduce heat generated in the form of conversion loss. An example of a high efficiency and low level EMI emitter is a LLC resonant full-bridge converter.

FIG. 2B illustrates an embodiment power supply circuit 205 of a display panel. The power supply circuit 205 includes a DC source, a first stage DC to DC converter 204, a second stage DC to DC converter 206, and a load. The power supply circuit 205 is similar to the power supply circuit 200, described above. In this illustration, the input to the display panel is a DC source as opposed to an AC source. The shared components in FIG. 2B and FIG. 2A share similar features and functions.

In FIGS. 2A-B, only the elements necessary for understanding the power supply circuits 200 205 are illustrated and additional elements have been omitted for the sake of simplicity. Also, it would be apparent to a person skilled in the art that the power supply circuits 200 205 may comprise other components and may be arranged in other configurations. Moreover, a display panel may have any power supply circuit that converts and/or conditions an input power source to the circuits and components in the display panel for proper functioning.

Figure 2C:
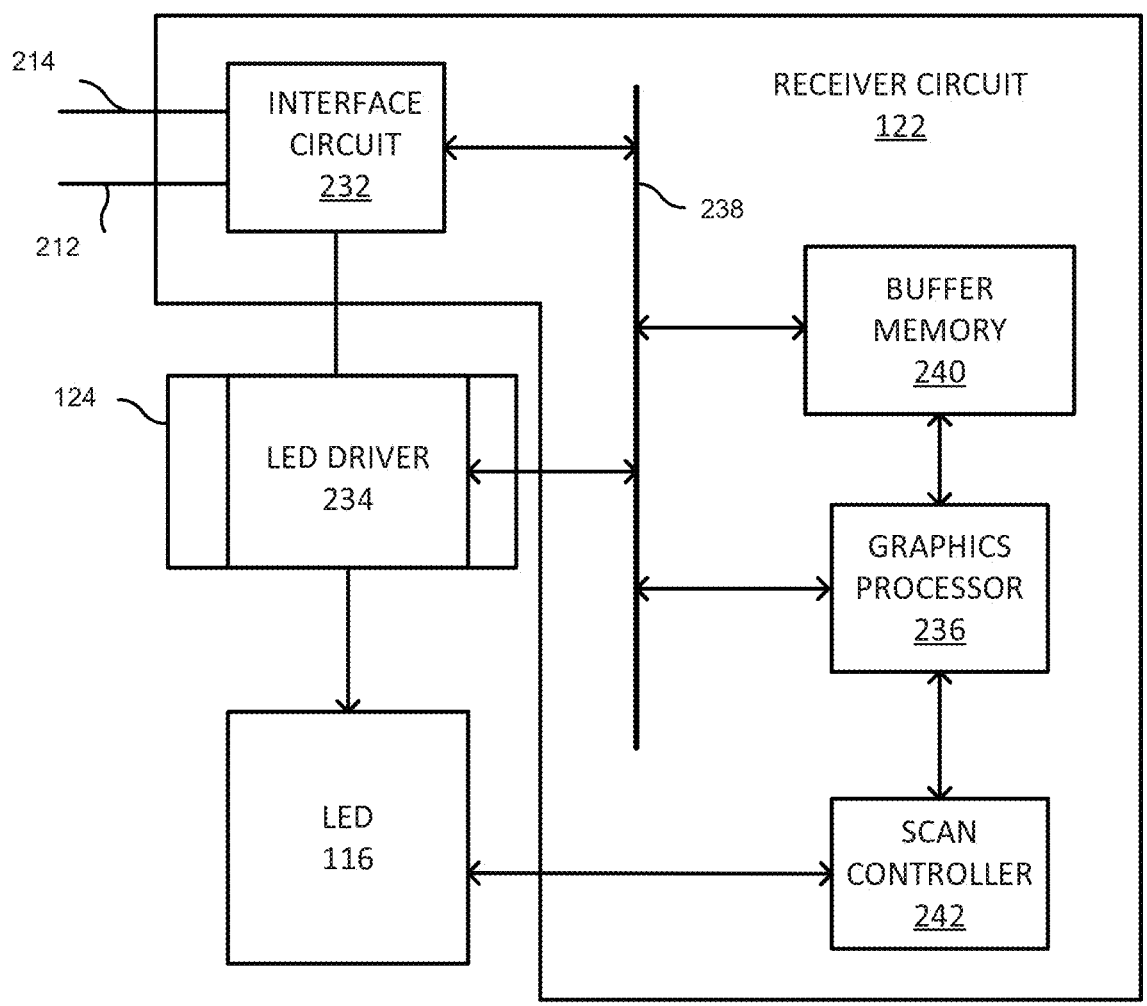

FIG. 2C illustrates a system diagram schematic of the display panel 210 in accordance with an embodiment of the present invention. The display panel 210 comprises an LED receiver circuit 122, a power supply 124, and LEDs 116. The LED receiver circuit 122 comprises an interface circuit 232, a receiver bus 238, a buffer memory 240, a graphics processor 236, and a scan controller 242. The power supply 124 comprises an LED driver 234.

The incoming power is provided to the components of the display panel 210, such as the power supply 124 and the LED driver 234. Generally, the incoming power is supplied from an AC power source, which can be 120V or 240V. The power supply 124 converts and regulates the AC power to DC voltage or regulates the current.

Normally, the LED driver 234 provides constant-current to the LEDs 116 while allowing the voltage to vary depending on the load. In general, the regulated current can vary from a couple hundred milliamps to an amperage of current.

In some embodiments, the power supply 124 may be configured to provide constant-voltage commonly around 1V DC to 10V DC. In some embodiments, a constant-current driver is part of the LED assembly and the power supply provides constant-voltage to the constant-current driver. In these embodiments, the current flowing through the LEDs are controlled using resistors or built-in regulators.

The forward voltage of an LED is the amount of voltage that is required for it to emit light. Generally the forward voltage of an LED varies within several volts, which is dependent on the type of LED (i.e., a Red LED typically has a forward voltage of 1.8V). As a general rule, the forward voltage increases as the light frequency increases.

As the LED lights up and its temperature increases, the forward voltage of the LED decreases. The decrease in the forward voltage causes the LED to draw additional current. The additional current increases the LED temperature and a thermal runaway situation occurs, which can result in the burnout of the LED. The LED driver 234 prevents this from happening by varying the forward voltage while delivering a constant current to the LED.

The display panel 210 receives data and power signals at the input cable 212. Another output from the incoming power may be provided to the output cable 214. This may provide redundancy so that even if a component in the display panel 212 is not working, the output power is not disturbed. Similarly, the output cable 212 includes all the data packets being received in the input cable 214.

The integrated power and data cables 212, 214 include wires for carrying data/control information and wires for carrying power. The data/control wires may be of the twisted pair variety. In some embodiments, the power and data cables are not integrated and several cables may be required to transmit the data and power signals (not shown). The length of the data and power wires may be controlled to provide signal propagation within each LED display panel within a specific time. The data/control wires may be configured to transport data at a high bit rate, e.g., at least 1 Mbit/s, and may be 100-1000 Mbit/s. To minimize noise, the cable as a whole may be shielded or the data/control wires or twisted pairs of data/control wires may be shielded separately. In some embodiments, the power connections to the power wires can be configured so that power is run across all of a row (or any other group of panels). In this manner, if the power supply of any one of the panels fails, the other panels will continue to operate.

The data and power signal received at the input cable 212 is processed at the interface circuit 232. The interface circuit 232 provides received data packets to the graphics processor 236 through a receiver bus 238. In some embodiments, the interface circuit 232 provides only the data packets intended for the display panel 210. In other embodiments, the interface circuit 232 provides all incoming data packets to the graphics processor 236. For example, in some embodiments, the graphics processor 236 may perform decoding of the received media. The graphics processor 236 may use the buffer memory 240, or frame buffer, as needed to store media packets during processing. The graphics processor 236 may perform additional signal processing techniques on the packets, such as decrypting, to provide the necessary signals for displaying the image for the display panel 210.

A scan controller 242, which may include an address decoder, receives the media to be displayed, and identifies individual LEDs that need to be controlled. The scan controller 242 may determine an individual LED's color, brightness, refresh time, and other parameters associated to generate the display. In one embodiment, the scan controller 242 may provide this information to the LED driver 234, which selects the appropriate current for the particular LED.

Alternatively, in an embodiment, the scan controller 242 may interface directly with the LEDs 116. For example, the LED driver 234 provides a constant current to the LEDs 116 while the scan controller 242 controls the select line needed to turn ON or OFF a particular LED. Further, in various embodiments, the scan controller 242 may be integrated into the LED driver 234.

Figure 3A:
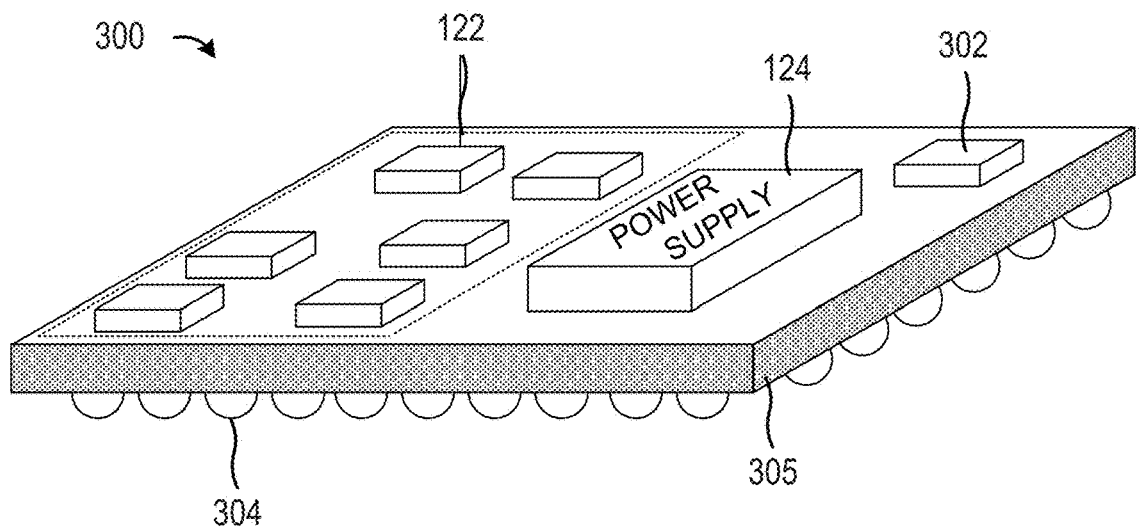
FIGS. 3A-3D illustrate various embodiments of the integration of a power supply and a receiver circuit.
Figure 3B:
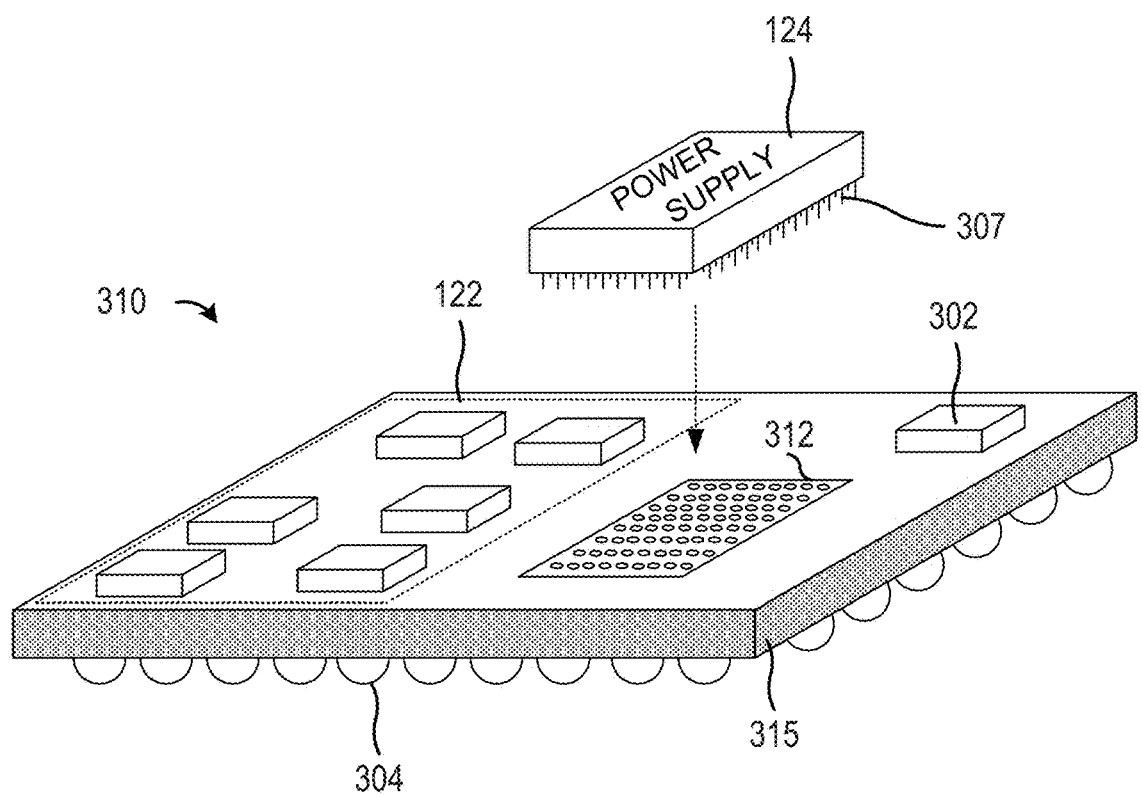
Figure 3C:
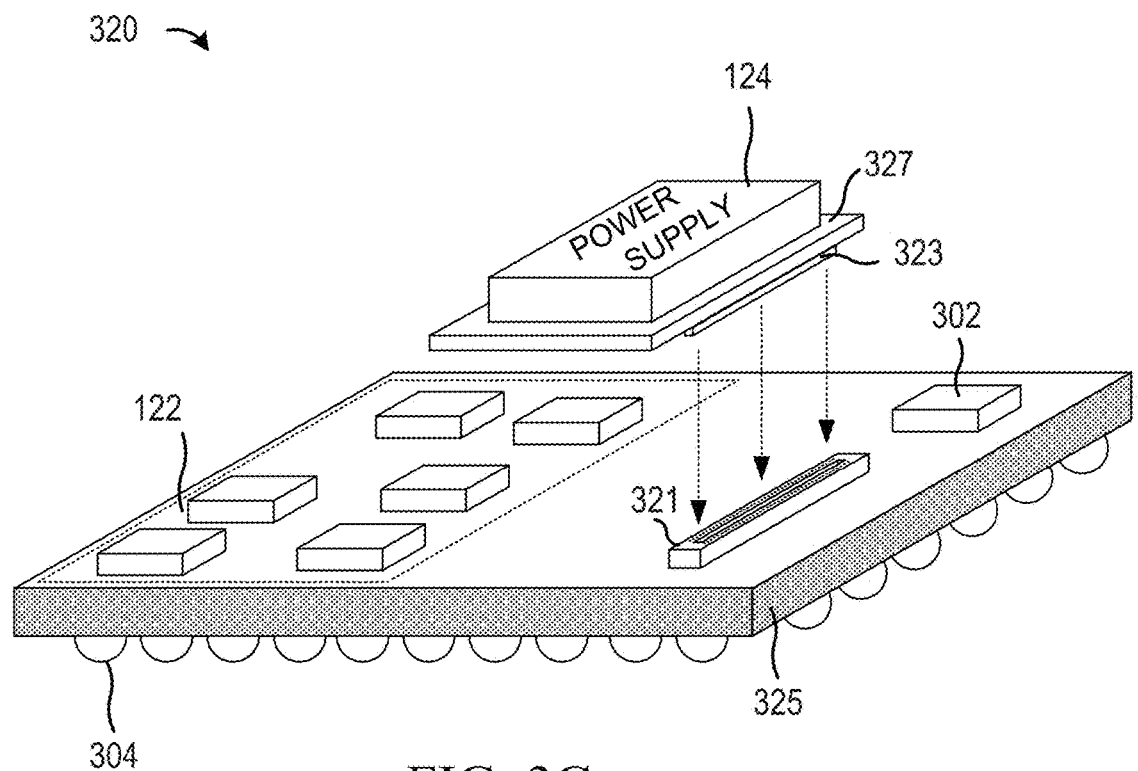
Figure 3D:
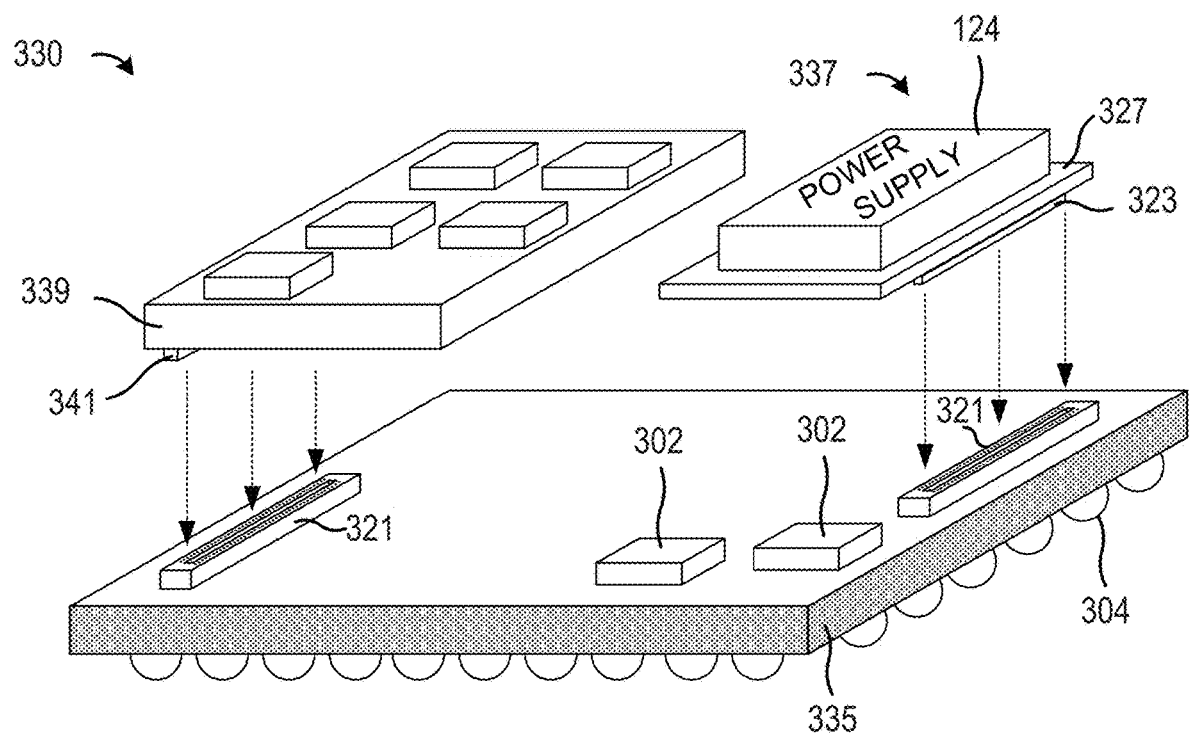

FIGS. 3A-3D illustrate various embodiments of the integration of the power supply 124 circuit with the LED receiver circuit 122. FIG. 3A illustrates an embodiment of a PCBA 300, where the power supply 124 is designed onto the same PCB 305 that the circuitry of the receiver circuit 122 is assembled. FIG. 3B illustrates an embodiment of a PCBA 310, where the power supply 124 is an off the shelf power supply that is mounted on a pre-fabricated interface of the PCB 315. FIG. 3C illustrates an embodiment of a PCBA 320, where the power supply 124 is integrated into a daughterboard 327 that can be easily interfaced with the PCB 325. FIG. 3D illustrates yet another embodiment of a PCBA 330, where the power supply 124 is integrated into a daughterboard 337 connected to a main PCB 335 that is also connected to a separate daughterboard 339 of the integrated receiver circuit 122.

Referring specifically to FIG. 3A, in one embodiment, the PCBA 300 includes the circuitry of the power supply 124 and the circuitry of the receiver circuit 122 on a same PCB 305. In addition to the receiver circuit 122 and the power supply 124 circuitry, the PCBA 300 may have other components 302, for example, a controller that is used to control and adjust specific settings of the display panel.

The PCB 305 may be a single sided, double sided, or a multi-layer board that has the electric traces and pad connections to mount the various circuitry required of the power supply 124 and the LED receiver circuit 122. Typically, FR-4 glass epoxy is the primary insulating material of the PCB 310 and the conductive traces, power planes, and vias are typically made of copper. Although, other types of insulating and conductive material may be used such as metal core boards or Teflon. The LED's 304 are connected to the PCB, for example, through pins soldered to the PCB or in the case of SMD LED's through a surface mount contact.

The power supply 124 may include a single component or several components. As an example, a power supply may have one or more of a transformer, a rectifier, a voltage regulator, a filter, a controller, capacitors, resistors, or inductors. In the illustration of the power supply 124, a single component is illustrated that comprises the various components that make the power supply circuitry. The power supply 124 may be packaged as a single device or may be directly assembled or directly mounted on the PCB 305 as individual components connected via the traces in the PCB 305.

In some embodiments of this disclosure, the power supply circuit can also comprise a processor and memory. In some embodiments, the processor and memory may be an existing component on the receiver circuit. The processor can be programmed to adjust the regulation of the power supply to accommodate the requirements of the LEDs or to more tightly control the regulation of the external power supply. The memory can hold the programming or certain predetermined settings of the panel.

The receiver circuit 122 may also include a single component or several components. As an example, a receiver circuit may have one or more of a filter, capacitors, resistors, inductors, or a controller. Similar to the power supply circuit, the receiver circuit 122 may be packaged as a single device or may be directly assembled or directly mounted on the PCB 305 as individual components connected via the traces in the PCB 305.

In some embodiments, a designer may lay out the circuitry of the receiver circuit 122 and the power supply 124 concurrently on the PCB 305. This allows for lower cost, tighter integration of the parts, minimization of the display panel, and better circuit layout.

Advantageously, integrated components decrease the number of modular components, in particular where the modular components are each hermetically sealed in an encasing. As an example, the integration of the circuitry of the power supply 124 and the receiver circuit 122 on a single PCB 305 can minimize the thickness of the panel from several inches to a fraction of an inch. As an example, a display panel in this configuration can have a thickness from 0.1 inches to 2.5 inches, significantly reducing the bulk and physical dimension of a typical display panel. Additionally, the weight of the display panel may be reduced to fractions of a kilogram per square foot of the display panel. As an example, a display panel in this configuration may have a weight from 1 kg to 20 kg per square meter of the display panel.

In order to accommodate the additional circuitry of the power supply, the designer may have to add additional board layers or modify the type of material and therefore the insulating material of the PCB. The designer may have to accommodate for the additional heat generated by the integrated power supply. Additionally, the designer may strategically place the power supply to minimize heat dissipation through the PCB and reduce electrical interference with the receiver circuit.

Referring specifically to FIG. 3B, in one embodiment, a PCBA 310 comprises a PCB 315 that may be designed with plated thru holes 312 to accommodate an off the shelf (OTS) power supply 124. The OTS power supply 124 may have several components that regulate the voltage in the display panel as illustrated in FIG. 2A. The OTS power supply 124 may have pins 307 that can be directly assembled or directly mounted by soldering to the PCB 315 concurrently with the assembly of the receiver circuit on the PCBA 310. In some embodiments, the PCB 315 may be designed with a different interface such as a ball grid array to allow for a low profile PCBA 310 to minimizes the assembled board thickness.

The PCBA 310 presents similar advantages found in the PCBA 300 of FIG. 3A. Additionally, a designer may find an OTS power supply that meets all the power requirements of a display panel while minimizing design impact to the receiver circuit 122. This advantageously provides a designer additional time for board layout while minimizing risks associated with design and assembly of a custom power supply.

Referring specifically to FIG. 3C, in one embodiment, a PCBA 320 comprising a PCB 325 may be designed to allow for the assembly of the receiver circuit 122. A second PCB 327 may be designed to allow for the direct assembly of the power supply 124. The PCB 325 and the power supply PCB 327 may have interconnects 321, 323 to transfer data and power between the power supply 124 and the receiver circuit 122. In this arrangement, the PCB 327 that contains the power supply 124 is called a daughterboard and has the interconnect interface 323 and the PCB 325 that contains the receiver circuit 122 is the main board. The integrated solution of the PCB 325 and the power supply 124 is the PCBA 320 that comprises the assembled components of the receiver circuit 122 and interconnect interface 321 to connect the power supply daughterboard.

The interconnect interface 321 between the power supply PCB 327 and PCB 325 may be one or a combination of flex cables, pins, sockets, ribbon cables, or any other type of quick connect/disconnect interconnect. The power interconnect may have the same interface as the data transfer interconnect. Alternatively, the interfaces for power and data may be different.

In an embodiment, the power supply daughterboard can be easily replaced by disconnecting it from the PCBA 320 or can be hot swappable. In some embodiments, the power supply daughterboard is replaced to remove a faulty unit or to upgrade the power supply 124, for example, to improve the efficiency in the power conversion. The expansion card form factor allows for quick assembly and disassembly from, for example, an expansion slot on the controller card.

Referring specifically to FIG. 3D, in one embodiment, a PCBA 330 comprises a main PCB 335 designed to accommodate a receiver circuit PCB 339 and a power supply PCB 337. The flexibility to easily replace the power supply 124 or the power supply daughterboard, having the components of the power supply circuit on PCB 337, and the receiver circuit daughterboard, having the components of the receiver circuit on PCB 339, provides a quick solution to swap faulty components or upgrade components in a modular fashion while still reducing the overall thickness of the panels.

The interconnect interface between the power supply daughterboard 323 and the interconnect interface between the receiver circuit daughterboard 341 to the PCBA 330 interconnect interface 321 may be one or a combination of a flex cables, pins, sockets, ribbon cables, or any other type of interconnect. The power interconnect may have the same interface as the data transfer interconnect. Alternatively, the interfaces for power and data may be different.

The PCB 315 of FIG. 3B, PCB 325 of FIG. 3C, and PCB 335 of FIG. 3D may be similar in design, material, construction, and assembly to the PCB 305 of FIG. 3A. The receiver circuit 122, the power supply circuit 124, the LEDs 304, and other components 302 illustrated on FIGS. 3B-3D may be similar in material, construction, and assembly to those illustrated on FIG. 3A. The interconnect interface 321 in FIG. 3D is similar in material, construction, and assembly to the interconnect interface 321 in FIG. 3C.

Figure 4A:
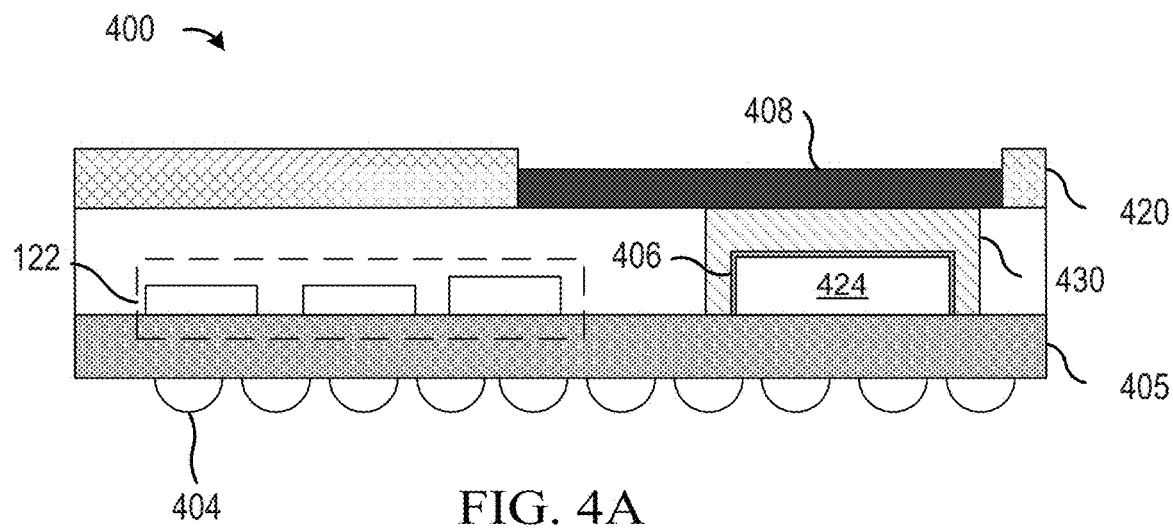
FIGS. 4A-C illustrate embodiments of an LED display panel with a thermal and RF insulator at various viewing angles and cross sections.
Figure 4B:
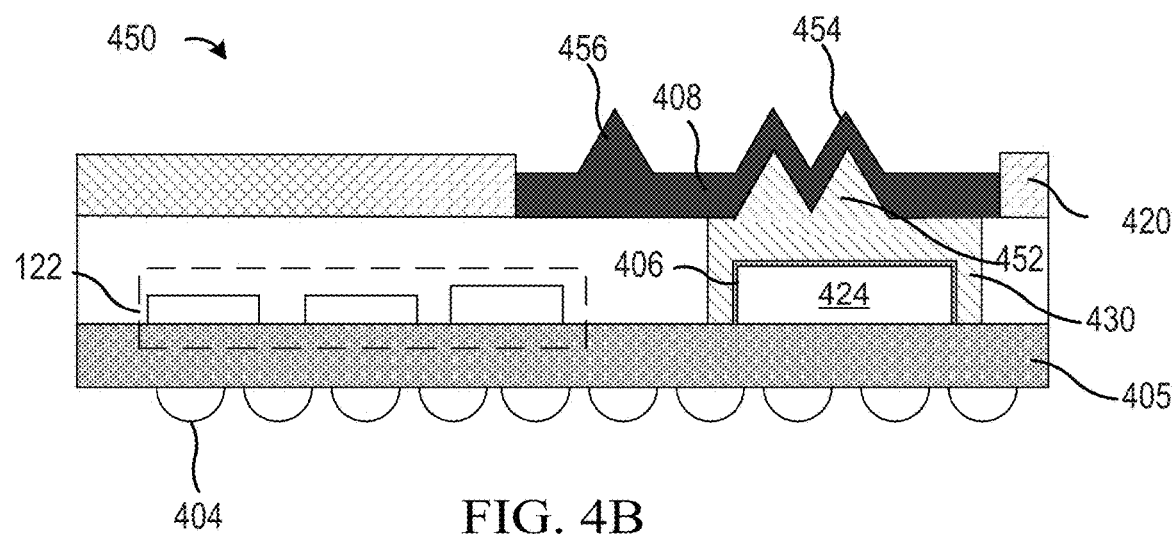
Figure 4C:
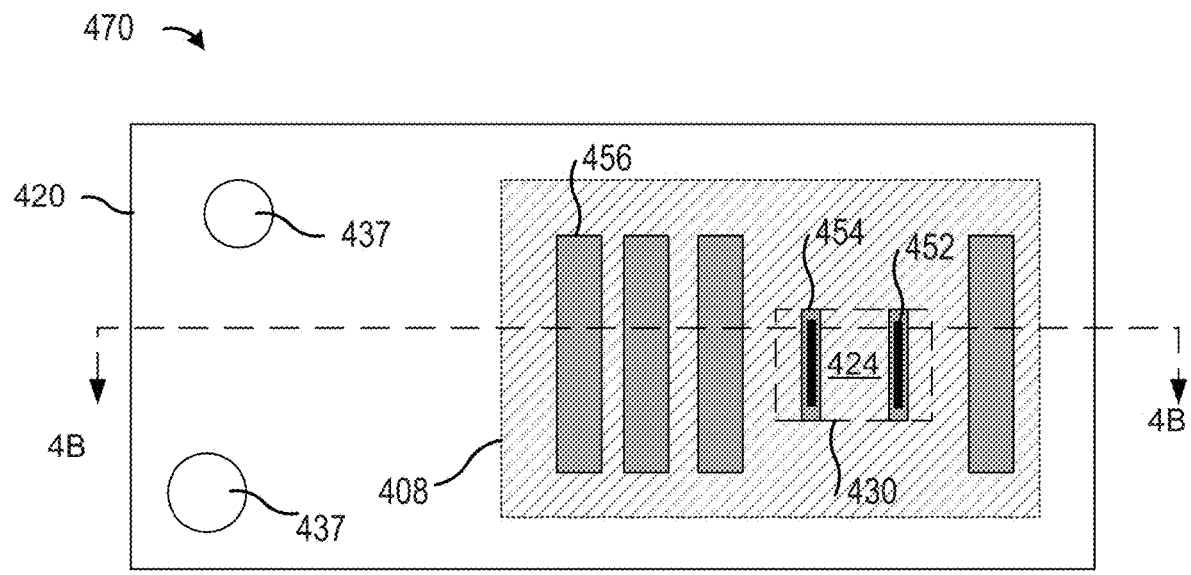
Figure 5:
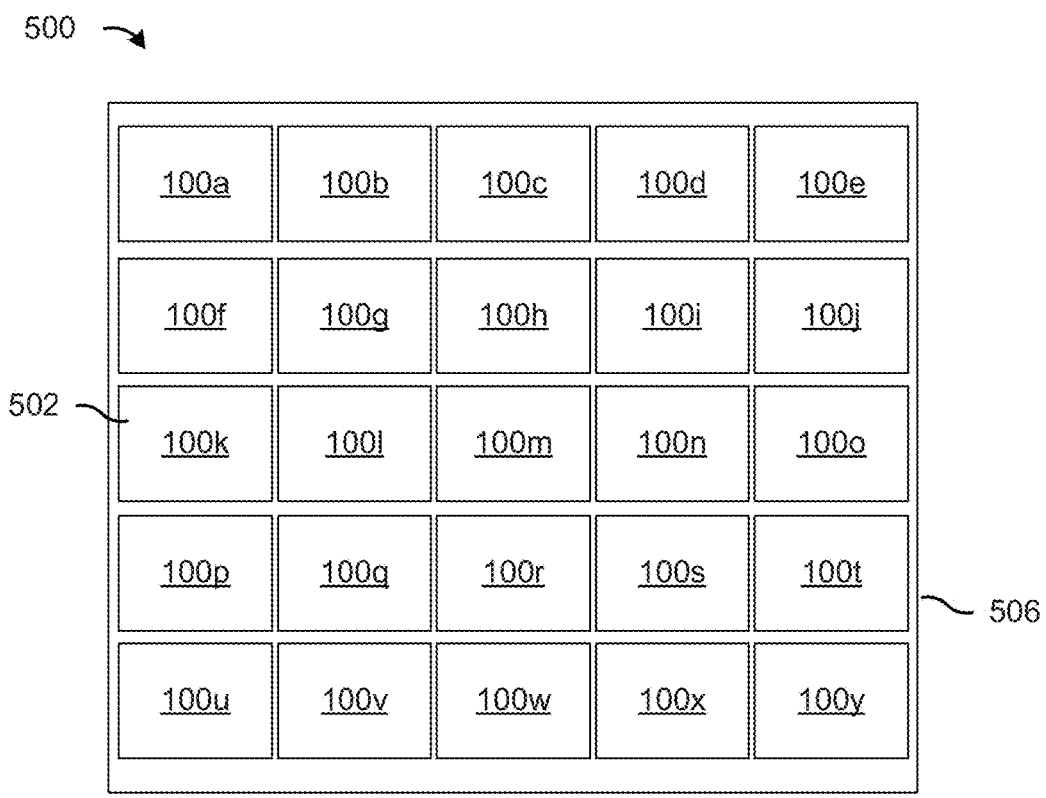
FIG. 5 illustrates an embodiment of a multi-panel LED display.

FIGS. 4A-C illustrate a side view of an embodiment display panel 400 having a thermally conductive material 430 surrounding the power supply circuit 424 and making contact with a back plate 408 of the panel 400. The power supply circuitry may be designed such as to create a thermal path away from the PCB 405 and towards a thermally conductive material such as the back plate 408. In FIGS. 4A-C, the display panel is illustrated with LEDs 404 on the front side of a PCB 405 and the receiver circuit 122 and the power supply circuit 424 on the back side of the PCB 405. The receiver circuits 122 and power supply circuit 424 may be coupled in various configurations to the PCB 405, as previously described in detail in FIGS. 3A-D.

FIG. 4A illustrates a side view of an embodiment of a display panel 400. In this illustration, the power supply circuit 424 is thermally coupled with an RF cage 406 structure. As described previously, the RF cage 406 may isolate RF signals between the power supply circuit 424 and the receiver circuit 122. The RF cage 406 may be made of a thermally conductive material higher than that of the power supply circuit 424 components and/or PCB 405 to channel heat away from the PCB 405. In some embodiments, the RF cage 406 may be thin and itself partially or fully surrounded by a thermal structure 430 made of a high thermal conductive material to channel the heat away from the RF cage 406. The thermal structure 430, or in some cases the RF cage 406, may be thermally coupled to a back plate 408. The thermal structure 430 may comprise a material with higher thermal conductivity than the back plate 408 in various embodiments. Since, the area of the thermal structure 430 is smaller, a relatively expensive material with a higher thermal conductivity may be chosen for the thermal structure 430. Examples of such materials include aluminum, copper, silver, graphite and other carbon allotropes, carbon composites, magnesium alloys, tungsten alloys including copper-tungsten, composites and alloys thereof.

In some embodiments, the back plate 408 and the back side of the display housing 420 may be made of different thermally conductive material. In some embodiments, the back plate 408 and the back side of the display housing 420 may be made of similar material. The back plate 408 channels the heat away from the thermal structure 430 and/or the RF cage 406 structure.

FIG. 4B illustrates a side view of an embodiment of a display panel 450. The components in FIG. 4B are similar to the components as described above with respect to FIG. 4A. Advantageously, in the display panel 450, the thermal structure 430 and the back plate 408, have fins 452, 454, 456 that improve heat dissipation and channel heat away from the PCB 405. The surface area of the thermal structure 430 is increased due to the structure of the fins. The back plate 408 conforms to the shape of the fins 452 of the thermal structure 430 and therefore further helps to dissipate heat quickly. In other words, the back plate 408 is pre-fabricated to include ridges 454 to match the fins 452 of the thermal structure 430. This ensures good physical and thermal contact between the back plate 408 and the thermal structure 430 as well as helps to align the two components during fabrication. In some embodiments, the fins 452 and ridges 454 may not be placed and the arrangement of the fins may be designed to best channel heat away from the power supply circuit 424. In addition, the back plate 408 may also include additional fins 456 since the area of the back plate 408 is larger than the area of the thermal structure 430.

FIG. 4C illustrates a back side view of an embodiment of a display panel 470. As illustrated, the fins 456 help channel heat away from the power supply circuit 424 towards the back plate 408. External connectors 437 are also illustrated to show an embodiment connector interface for communicating with the display panel 470. As illustrated the ridges 454 are larger than the fins 452.

In FIGS. 4A-C, the back plate 408, and all or portions of back side of the display housing 420 may be made of aluminum, carbon fiber composite, titanium alloys, magnesium alloys, tungsten alloys, thermally conductive plastic, or any other such high thermally conductive material. The material may be chosen to advantageously channel heat away from the PCB 405 towards the back plate 408 while accounting for environmental operating conditions, structure weight, and material costs.

The thermally structure 430 may be a RF cage that is designed to improve signal isolation between the power supply circuit and the LED receiver circuit. In an embodiment, the RF cage may make contact with a region of the power supply circuit to create a thermal path away from the PCB 405. In an embodiment, the RF cage may then be connected to an external or internal section of the back plate 408 to create a thermal path away from the PCB 405 and to the back plate 408. To improve heat dissipation, the thermal structure 430 may have lower thermal conductivity than the back plate 408. The back plate 408 may have greater thermal conductivity than the rest of the housing 420. However, fins and materials of higher conductivity are optional.

FIG. 5 illustrates an embodiment of a multi-panel display 500. The multi-panel display 500 includes a display surface 502 that is formed by multiple lighting panels 100a-100y. Each panel 100a-100y is a self-contained unit that couples to the frame 506. The panels 100a-100y may each be a display panel 100 as described in FIG. 1. Embodiments of the invention provide building block panels that are configurable with future expandability. These displays can offer complete expandability to upgrade in the future without having to replace the entire display. Installation is fast and easy with very little downtime, which allows any electronic message to be presented more quickly.

Two or more panels 100a-100y can be coupled for power and/or data purposes, with a panel 100a-100y receiving power and/or data from a central source or another panel and passing through at least some of the power and/or data to one or more other panels. This further improves the modular aspect of the multi-panel display 500, as a single panel 100a-100y can be easily connected to the multi-panel display 500 when being installed and easily disconnected when being removed by decoupling the power and data connections from neighboring panels.

The power and data connections for the panels 100a-100y may be configured using one or more layouts, such as a ring, mesh, star, bus, tree, line, or fully connected layout, or a combination thereof. In some embodiments the LED panels 100a-100y may be in a single network, while in other embodiments the LED panels 100a-100y may be divided into multiple networks. Power and data may be distributed using identical or different layouts. For example, power may be distributed in a line layout, while data may use a combination of line and star layouts.

In some embodiments, the display panels are "hot swappable." By removing a display panel, using for example, screws in each of the four corners of the panel, servicing the display is fast and easy. Since a highly trained, highly paid electrician or LED technician is not needed to correct a problem, cost benefits can be achieved.

A benefit of the method and systems disclosed herein is that the integration of the power supply with the PCBA reduces the thickness and consequently bulk of the display panel. The less bulky the display panel, the easier to replace individual units in case of failure or maintenance, which has an impact on cost and ease of repair and installation.

In some embodiments, it is advantageous to build multi-panel displays where each of the display panels have the same type of power supply design. The consistency in providing the regulated power to the LED drivers and the LEDs provides consistent quality of the visual image. While not necessary, it is helpful because the overall image provided by the display panels can vary depending on the constancy of the image from each panel.

It should be noted that the disclosed systems and methods can be applied to a display panel with an integrated power supply that is rated to IP 67 and therefore waterproof and corrosion resistant. Because weather is the number one culprit for damage to LED displays, and IP 67 rating provides weatherproofing with significant weather protection. These panels are completely waterproof against submersion in up to 3 feet of water. In other embodiments, the equipment can be designed with an IP 68 rating to operate completely underwater. In lower-cost embodiments where weatherproofing is not as significant, the panels can have an IP 65 or IP 66 rating. A display panel enclosure rated to an IP X5 rating protects the display panel from water jets projected by a nozzle (6.3 mm) from any direction. A display panel enclosure rated to an IP X6 rating protects the display panel from powerful water jets projected by a nozzle (12.5 mm) from any direction. A display panel enclosure rated to an IP X7 rating protects the display panel from immersion up to 1 meter. A display panel enclosure rated to an IP X8 rating protects the display panel from immersion beyond 1 meter. A display panel rated to the IP X8 rating is hermetically sealed, however, in some types of equipment water may enter but only if it does not harm the device.

A display panel enclosure rated to an IP5Y rating limits ingress of dust into the display panel such that dust does not interfere with typical satisfactory operation, whereas a display panel enclosure rated to an IP6Y rating completely protects the display panel from ingress of dust. The display panel enclosure may be designed for the dust or water resistance of the environment that it is deployed. As an example, a billboard deployed in a dry environment does not necessarily need to be rated at IP X8 for proper functioning.

Additionally, the disclosed systems and methods can be applied to a display panel and an integrated power supply that is rated to operate in extreme temperature conditions. As an example, the enclosures and the display panels can operate at operating temperatures up to 200 degrees Celsius and as cold as −60 Celsius.

Figure 6:
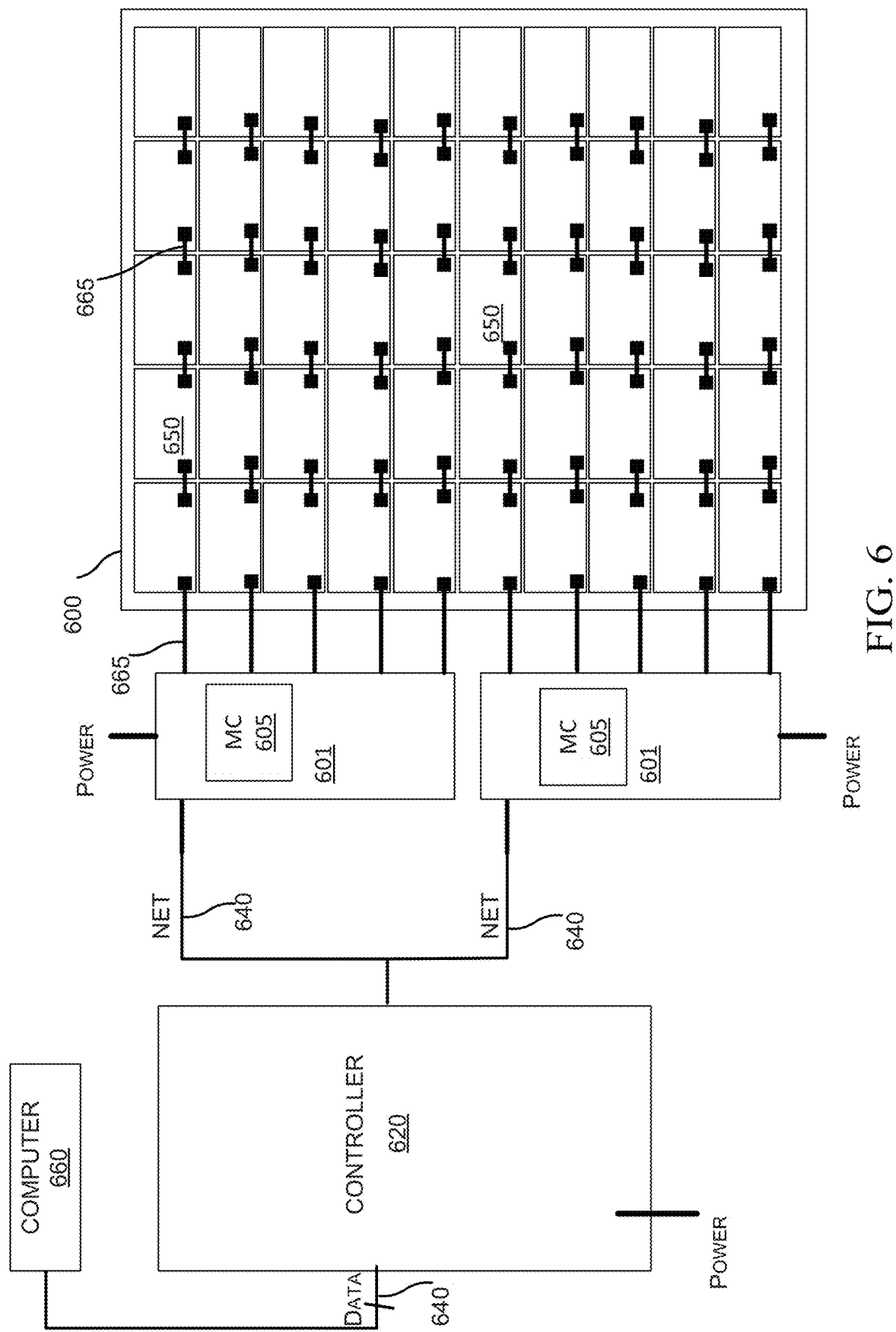
FIG. 6 illustrates an embodiment of a system having display panels.
Figure 7:
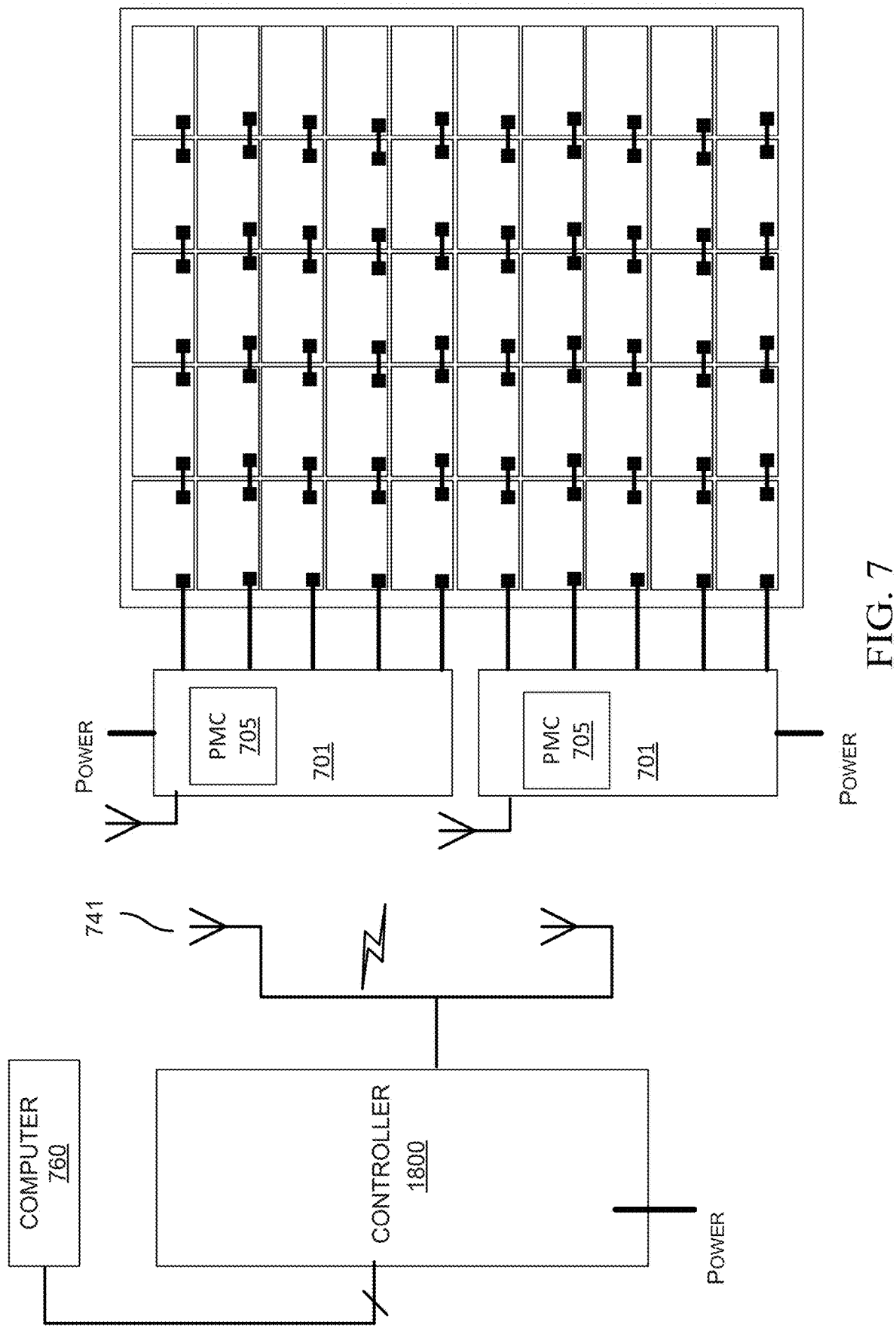
FIG. 7 illustrates an alternative embodiment of a system having display panels with wireless connectivity.

FIG. 6 illustrates an embodiment describing a monitoring controller 605 disposed within a data receiver box 601. The monitoring controller 605 is configured to monitor power failure in one or more display panels 650 and report to the computer 660 or to a different receiving monitoring server.

In various embodiments, the monitoring controller 605 is configured to monitor illumination or brightness of one or more display panels 650. The monitoring controller 605 may also monitor the network between the data receiver box 601 and the outside internet 640 including computer 660 as well as the local area network 665 (or equivalent wireless network) connecting the individual display panels 650 of the display system 600.

The computer 660 sends data via the network 640 to the controller 620. The controller may comprise components to transmit the data from the computer to the data receiver box 601 via the network 640. In some embodiments, the controller may comprise a card configured to transmit data via a wireless or wired network. In some embodiments, the controller may also comprise a microcontroller to, for example, adjust resolution transmitted to the display panel.

The monitoring controller 605 may be used for other purposes as well. For example, in one or more embodiments, the display panels 650 may include one or more sensors to self-regulate operation based on external conditions. For example, the sensor may reduce or increase the brightness of the display panels based on the ambient light. Alternatively, in some embodiments, the display panels may sense the presence of an observer (e.g., human) and modulate the content being displayed. For example, the display may be powered off until a human approaches the display.

FIG. 7 illustrates an alternative embodiment, in which the data receiver box 701 also has wireless connectivity. The data receiver box 701 may include wired data connection 640 as described in FIG. 6, as well as wireless data connection 741 as illustrated in FIG. 7. Accordingly, for example, if a network failure is detected, the monitoring circuit 705 may generate an error message, which is then transmitted to a monitoring server or the computer 760 using the wireless channel.

The embodiments of this disclosure advantageously integrate a power supply circuit to a PCB of a display panel that can be, for example, mounted outdoors. The integration of the power supply circuit in a hermetically sealed packaging (or other waterproof packaging such as IP67-IP68 packaging), that may be exposed to dust and water elements, allows for thinner and lighter display boards. The embodiments of this application provide solutions for integrating the power supply while reducing/removing the environmental constraints such as heat generated during operation. The embodiments of this disclosure further illustrate methods and systems that convert, for example, industrial level power for individual display panel operation in an array of panels. Furthermore, these embodiments illustrate methods for hot swapping and upgrading panels and/or to quickly restore damaged displays of a billboard. Lighter and thinner billboards reduce assembly and maintenance costs associated with mounting the billboards, for example, to large buildings. Thinner billboards also help in meeting regulations in tight spaces/buildings that have strict requirements for the protruding displays. Embodiments of the invention may also be applied to displays that have through wind holes in the displays for allowing wind to pass through the billboard so that the displays can be installed in windy environments without creating wind blocks.

Example embodiments of the present invention are summarized here. Other embodiments can also be understood from the entirety of the specification and the claims filed herein.

Example 1. A modular display panel includes a first printed circuit board (PCB), a plurality of LEDs, a receiver circuit, and a power supply circuit. The first PCB has a first side and a second side. The plurality of LEDs are connected to the first side of the PCB. The receiver circuit is directly mounted to the second side of the first PCB and the receiver circuit includes a first plurality of components. The power supply circuit is directly mounted to the second side of the first PCB and the power supply circuit includes a second plurality of components.

Example 2. The modular display panel of example 1, where each of the first plurality of components and each of the second plurality of components are directly mounted to the second side of the first PCB.

Example 3. The modular display panel of example 1, further includes a packaged component. The packaged component includes each of the second plurality of components and the packaged component is directly mounted to the second side of the first PCB.

Example 4. The modular display panel of examples 1 and 3, further includes a structure connected to the packaged component, the structure being a radio frequency (RF) insulator and a thermal conductor.

Example 5. The modular display panel of example 1, where the power supply circuit further includes a second PCB directly mounted to the second side of the first PCB and each of the second plurality of components are directly mounted to the second PCB.

Example 6. The modular display panel of examples 1 and 5, where the receiver circuit further includes a third PCB directly mounted to the second side of the first PCB and each of the first plurality of components are directly mounted to the third PCB.

Example 7. The modular display panel of example 1, where the power supply circuit directly mounted to the second side of the first PCB is attached to the first PCB in a non-permanent mounting configuration.

Example 8. The modular display panel of example 1 1, further includes a plurality of interconnects. The plurality of interconnects includes power and data signals and connects the modular display panel to another modular display panel.

Example 9. A first modular display panel includes a first printed circuit board (PCB), a plurality of LEDs, a receiver circuit, a power supply circuit, and a heatsink. The first PCB has a first side and a second side. The plurality of LEDs are connected to the first side of the PCB. The receiver circuit is directly assembled to the second side of the first PCB and the receiver circuit includes an integrated circuit (IC) soldered to a first region of the first PCB. The power supply circuit is directly assembled to the second side of the first PCB and the power supply circuit includes a plurality of discrete semiconductor devices soldered to a second region of the first PCB and one of the plurality of discrete semiconductor devices is configured to receive alternating current (AC) power. The power supply circuit is configured to convert the AC power to direct current (DC) power. The heat sink is disposed over the power supply circuit and the heat sink is thermally coupled to the power supply circuit to form a part of a major outer surface of the first modular display panel.

Example 10. The first modular display panel of example 9, further includes a plurality of interconnects that includes power and data signals. The plurality of interconnects connect the first modular display panel to a second modular display panel.

Example 11. The first modular display panel of example 9, where each of the plurality of discrete semiconductor devices includes a power semiconductor device configured to operate at voltages exceeding 24 V.

Example 12. The first modular display panel of examples 9 and 11, where the power semiconductor device includes vertical semiconductor devices integrated on a single monolithic substrate.

Example 13. The first modular display panel of example 9, further includes a structure connected to a packaged component, the structure being a radio frequency (RF) insulator and a thermal conductor.

Example 14. The first modular display panel of example 9, further includes a thermal structure surrounding the power supply circuit and a back plate contacting the thermal structure, where the back plate forms the heat sink.

Example 15. The first modular display panel of examples 9 and 14, further includes fins disposed on the thermal structure and ridges disposed on the back plate. The fins interlock with the ridges to form a thermal contact.

Example 16. The first modular display panel of examples 9, 14, and 15, where the ridges are longer than the fins.

Example 17. The first modular display panel of examples 9, 14, and 15, where the back plate includes additional fins not overlapping with the thermal structure.

Example 18. The first modular display panel of examples 9 and 14, where the thermal structure has a higher thermal conductivity than the back plate.

Example 19. The first modular display panel of examples 9 and 14, further includes a housing for holding the first PCB. The back plate having a higher thermal conductivity than the housing.

Example 20. The first modular display panel of example 9, where the IC is selected from a group consisting of a buffer memory, a graphics processor, a scan controller, an interface circuit, and an LED driver.

Example 21. The first modular display panel of example 9, where the plurality of discrete semiconductor devices is selected from a group consisting of a power source, a rectifier, a plurality of DC to DC converters, an electromagnetic interference (EMI) filter, storage banks, boost power factor correction (PFC) converter, and a step down transformer.

Example 22. A system includes a plurality of modular display panels, each of the plurality of modular display panels includes a first printed circuit board (PCB), a plurality of LEDs, a receiver circuit, and a power supply circuit. The PCB has a first side and a second side. The plurality of LEDs are connected to the first side of the PCB. The receiver circuit is directly mounted to the second side of the first PCB and the receiver circuit includes a first plurality of components. The power supply circuit is directly mounted to the second side of the first PCB and the power supply circuit includes a second plurality of components.

Example 23. The system of example 22, where each of the plurality of modular display panels further includes a packaged component including each of the second plurality of components. The packaged component is directly mounted to the second side of the first PCB.

Example 24. The system of example 22, where the power supply circuit in each of the plurality of modular display panels further includes a second PCB directly mounted to the first PCB. Each of the second plurality of components are directly mounted to the second PCB.

Example 25. The system of examples 22 and 24, where the receiver circuit in each of the plurality of modular display panels further includes a third PCB directly mounted to the first PCB. Each of the first plurality of components are directly mounted to the third PCB.

Example 26. The system of example 22, further includes a first plurality of modular display panels, a second plurality of modular display panels, and third plurality of modular display panels. Each of the modular display panels in the first plurality of modular display panels further includes a packaged component that includes each of the second plurality of components. The packaged component is directly mounted to the second side of the first PCB. The power supply circuit in each of the second plurality of modular display panels further includes a second PCB. Each of the second plurality of components are directly mounted to the second PCB. The third plurality of modular display panels having each of the first plurality of components and each of the second plurality of components directly mounted to the second side of the first PCB.

A person of ordinary skill in the art may understand that all or some of the processes of the methods in the embodiments may be implemented by a computer program instructing relevant hardware. The program may be stored in a computer-readable storage medium. When the program runs, the processes of the methods in the embodiments are executed in the processor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2A-B and 3A-D may be combined with each other in alternative embodiments. It is therefore intended that the appended claims encompass any such modifications or embodiments.

What is claimed is:

1. A modular display panel comprising:
   a first printed circuit board (PCB) having a first side and a second side;
   a plurality of LEDs mounted to the first side of the PCB;
   a receiver circuit solder mounted to the second side of the first PCB, wherein the receiver circuit comprises a first plurality of components;
   a power supply circuit solder mounted to the second side of the first PCB, wherein the power supply circuit comprises a second plurality of components, the power supply circuit being directly placed onto a surface of the second side of the first PCB;
   a thermal structure surrounding the power supply circuit; and
   a back plate contacting the thermal structure, the back plate forming a heat sink, the thermal structure having a higher thermal conductivity than the back plate.

2. The modular display panel of claim 1, wherein each of the first plurality of components and each of the second plurality of components are directly mounted to the second side of the first PCB.

3. The modular display panel of claim 1, further comprising:
   a packaged component comprising each of the second plurality of components, wherein the packaged component is directly mounted to the second side of the first PCB.

4. The modular display panel of claim 3, further comprising:
   a structure coupled to the packaged component, the structure being a radio frequency (RF) insulator and a thermal conductor.

5. The modular display panel of claim 1, wherein the power supply circuit further comprises:
   a second PCB directly mounted to the second side of the first PCB, wherein each of the second plurality of components are directly mounted to the second PCB.

6. The modular display panel of claim 5, wherein the receiver circuit further comprises:
   a third PCB directly mounted to the second side of the first PCB, wherein each of the first plurality of components are directly mounted to the third PCB.

7. The modular display panel of claim 1, wherein the power supply circuit directly mounted to the second side of the first PCB is attached to the first PCB in a non-permanent mounting configuration.

8. The modular display panel of claim 1, further comprising:

a plurality of interconnects comprising power and data signals, the plurality of interconnects connecting the modular display panel to another modular display panel.

9. A first modular display panel comprising:
a first printed circuit board (PCB) having a first side and a second side;
a plurality of LEDs mounted to the first side of the PCB;
a receiver circuit directly assembled to the second side of the first PCB, wherein the receiver circuit comprises an integrated circuit (IC) soldered to a first region of the first PCB;
a power supply circuit directly assembled to the second side of the first PCB, wherein the power supply circuit comprises a plurality of discrete semiconductor devices soldered to a second region of the first PCB, wherein one of the plurality of discrete semiconductor devices of the power supply circuit is configured to receive alternating current (AC) power, wherein the power supply circuit is configured to convert the AC power to direct current (DC) power;
a heat sink disposed over the power supply circuit, the heat sink thermally coupled to the power supply circuit and forming a part of a major outer surface of the first modular display panel;
a thermal structure surrounding the power supply circuit and comprising fins, the fins disposed on the thermal structure; and
a back plate contacting the thermal structure and comprising ridges, the back plate forming the heat sink, the ridges disposed on the back plate and interlocking with the fins of the thermal structure to form a thermal contact.

10. The first modular display panel of claim 9, further comprising:
a plurality of interconnects comprising power and data signals, the plurality of interconnects connecting the first modular display panel to a second modular display panel.

11. The first modular display panel of claim 9, wherein each of the plurality of discrete semiconductor devices comprises a power semiconductor device configured to operate at voltages exceeding 24 V.

12. The first modular display panel of claim 11, wherein the power semiconductor device comprises vertical semiconductor devices integrated on a single monolithic substrate.

13. The first modular display panel of claim 9, further comprising:
a structure coupled to a packaged component, the structure being a radio frequency (RF) insulator and a thermal conductor.

14. The first modular display panel of claim 9, wherein the ridges are longer than the fins.

15. The first modular display panel of claim 9, wherein the back plate comprises additional fins not overlapping with the thermal structure.

16. The first modular display panel of claim 9, wherein the thermal structure has a higher thermal conductivity than the back plate.

17. The first modular display panel of claim 9, further comprising a housing for holding the first PCB, wherein the back plate has a higher thermal conductivity than the housing.

18. The first modular display panel of claim 9, wherein the IC is selected from a group consisting of a buffer memory, a graphics processor, a scan controller, an interface circuit, and an LED driver.

19. The first modular display panel of claim 9, wherein the plurality of discrete semiconductor devices is selected from a group consisting of a power source, a rectifier, a plurality of DC to DC converters, an electromagnetic interference (EMI) filter, boost power factor correction (PFC) converter, and a step down transformer.

20. A system comprising:
a plurality of interconnected modular display panels, each of the plurality of interconnected modular display panels comprising:
a first printed circuit board (PCB) having a first side and a second side, the second side of the first PCB comprising a first PCB interconnect interface and a second PCB interconnect interface;
a plurality of LEDs mounted to the first side of the PCB;
a receiver circuit having an expansion card form factor physically attached to the first PCB interconnect interface, wherein the receiver circuit comprises a first plurality of components;
a power supply circuit having an expansion card form factor physically attached to the second PCB interconnect interface, wherein the power supply circuit comprises a second plurality of components: and
a housing for holding the first PCB;
a thermal structure surrounding the power supply circuit; and
a back plate contacting the thermal structure, a thermal conductivity of the back plate being higher than a thermal conductivity of the housing.

21. The system of claim 20, wherein each of the plurality of interconnected modular display panels further comprises:
a packaged component comprising each of the second plurality of components, wherein the packaged component is solder mounted to the second side of the first PCB, the solder mounting comprising placing the packaged component directly onto a surface of the second side of the first PCB.

22. The system of claim 20, wherein the power supply circuit in each of the plurality of interconnected modular display panels further comprises:
a second PCB solder mounted to the first PCB, wherein each of the second plurality of components are directly mounted to the second PCB, the second PCB being placed directly onto the first PCB.

23. The system of claim 22, wherein the receiver circuit in each of the plurality of interconnected modular display panels further comprises:
a third PCB solder mounted to the first PCB, wherein each of the first plurality of components are solder mounted to the third PCB.

24. The system of claim 20, further comprising:
a first plurality of modular display panels wherein each of the modular display panels in the first plurality of modular display panels further comprises a packaged component comprising each of the second plurality of components, wherein the packaged component is solder mounted to the second side of the first PCB, the packaged component being placed directly onto a surface of the second side of the first PCB;
a second plurality of modular display panels wherein the power supply circuit in each of the second plurality of modular display panels further comprises a second PCB, wherein each of the second plurality of components are solder mounted to the second PCB, each of second plurality of components being placed directly onto the second PCB; and a third plurality of modular display panels wherein each of the modular display panels in the third plurality of modular display panels having each of the first plurality of components and each of the second plurality of components solder mounted to the second side of the first PCB, each of the second plurality of components being placed directly onto the second side of the first PCB.

25. The system of claim 20, wherein the first PCB interconnect interface or the second PCB interconnect interface comprises a flex cable, a pin, a socket, or a ribbon cable type interface.

26. The system of claim 20, wherein each of the plurality of interconnected modular display panels is physically attached to a frame in a multi-panel display.

27. A modular display panel comprising:
a printed circuit board (PCB) having a first side and a second side, the second side of the PCB comprising a PCB interconnect interface;
a plurality of LEDs mounted to the first side of the PCB;
a power supply circuit having an expansion card form factor physically attached to the PCB interconnect interface, the power supply circuit configured to convert an alternating current (AC) power input to a direct current (DC) power output;
a thermal structure surrounding the power supply circuit and comprising fins disposed on the thermal structure; and
a back plate contacting the thermal structure and comprising ridges disposed on the back plate, the back plate forming a heat sink, the thermal structure having a higher thermal conductivity than the back plate, the fins interlocking with the ridges to form a thermal contact, the ridges being longer than the fins.

28. The modular display panel of claim 27, wherein the PCB interconnect interface is a flex cable, a pin, a socket, or a ribbon cable type interface.

29. The modular display panel of claim 27, further comprising a receiver circuit soldered to the second side of the PCB, the receiver circuit configured to control an operation of each of the plurality of LEDs.

30. A modular display panel comprising:
a printed circuit board (PCB) having a first side and a second side, the second side of the PCB comprising a PCB interconnect interface;
a plurality of LEDs mounted to the first side of the PCB;
a receiver circuit having an expansion card form factor physically attached to the PCB interconnect interface, the receiver circuit configured to control an operation of each of the plurality of LEDs; and
a power supply circuit solder mounted to the second side of the first PCB, wherein the power supply circuit comprises a second plurality of components, the power supply circuit being placed directly onto a surface of the second side of the first PCB; and
a thermal structure surrounding the power supply circuit and comprising fins disposed on the thermal structure; and
a back plate contacting the thermal structure and comprising ridges and additional fins disposed on the back plate, the back plate forming a heat sink, the thermal structure having a higher thermal conductivity than the back plate, the fins interlocking with the ridges to form a thermal contact, the additional fins not overlapping with the thermal structure.

31. The modular display panel of claim 30, wherein the PCB interconnect interface is a flex cable, a pin, a socket, or a ribbon cable type interface.

32. The modular display panel of claim 30, wherein the receiver circuit comprises a power supply circuit configured to convert an alternating current (AC) power input to a direct current (DC) power output.

33. A system comprising:
a plurality of interconnected modular display panels, each of the plurality of interconnected modular display panels comprising:
a printed circuit board (PCB) having a first side and a second side, the second side of the PCB comprising a PCB interconnect interface;
a plurality of LEDs mounted to the first side of the PCB; and
a power supply circuit having an expansion card form factor physically attached to the PCB interconnect interface, the power supply circuit configured to convert an alternating current (AC) power input to a direct current (DC) power output;
a thermal structure surrounding the power supply circuit; and
a back plate contacting the thermal structure, the back plate forming a heat sink, the thermal structure having a higher thermal conductivity than the back plate.

34. The system of claim 33, wherein the PCB interconnect interface is a flex cable, a pin, a socket, or a ribbon cable type interface.

35. The system of claim 33, wherein the PCB further includes a second PCB interconnect interface, wherein each of the plurality of interconnected modular display panels further comprises a receiver circuit having an expansion card form factor physically attached to the second PCB interconnect interface, the receiver circuit configured to control an operation of each of the plurality of LEDs.

36. A modular display panel comprising:
a printed circuit board (PCB) having a first side and a second side;
a plurality of LEDs mounted to the first side of the PCB;
a receiver circuit directly assembled to the second side of the first PCB, wherein the receiver circuit comprises an integrated circuit (IC) soldered to a first region of the first PCB;
a power supply circuit directly assembled to the second side of the first PCB, wherein the power supply circuit comprises a plurality of discrete semiconductor devices soldered to a second region of the first PCB, wherein one of the plurality of discrete semiconductor devices of the power supply circuit is configured to receive alternating current (AC) power, wherein the power supply circuit is configured to convert the AC power to direct current (DC) power, each of the plurality of discrete semiconductor devices comprises a power semiconductor device configured to operate at voltages exceeding 24 V;
a heat sink disposed over the power supply circuit, the heat sink thermally coupled to the power supply circuit and forming a part of a major outer surface of the modular display panel; and
a thermal structure surrounding the power supply circuit and comprising fins, the fins disposed on the thermal structure; and a back plate contacting the thermal structure and comprising ridges, the back plate forming the heat sink, the ridges disposed on the back plate and interlocking with the fins of the thermal structure to form a thermal contact.

37. The modular display panel of claim 36, wherein the thermal structure has a higher thermal conductivity than the back plate.

\* \* \* \* \*

UNITED STATES PATENT AND TRADEMARK OFFICE
CERTIFICATE OF CORRECTION

PATENT NO. : 10,727,269 B2  
APPLICATION NO. : 15/793333  
DATED : July 28, 2020  
INVENTOR(S) : Matthew Foster Page 1 of 1

It is certified that error appears in the above-identified patent and that said Letters Patent is hereby corrected as shown below:

In the Claims

In Column 20, Line 28, Claim 20, delete "plurality of components:" and insert --plurality of components;--.

Signed and Sealed this  
Sixth Day of October, 2020

Andrei Iancu  
*Director of the United States Patent and Trademark Office*